(12) United States Patent
Fujii et al.

(10) Patent No.: US 6,492,597 B2
(45) Date of Patent: Dec. 10, 2002

(54) WIRING SUBSTRATE, MULTI-LAYERED WIRING SUBSTRATE AND METHOD OF FABRICATING THOSE

(75) Inventors: Kenzo Fujii; Taro Hirai, both of Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/739,890

(22) Filed: Dec. 20, 2000

(65) Prior Publication Data

US 2001/0002625 A1 Jun. 7, 2001

(51) Int. Cl.⁷ .................................................. H05K 1/03
(52) U.S. Cl. ........................ 174/255; 174/261; 361/792; 361/793
(58) Field of Search ................................. 174/255, 261, 174/262, 256; 361/792, 793; 257/778; 29/845

(56) References Cited

U.S. PATENT DOCUMENTS

| | | | | |
|---|---|---|---|---|
| 4,978,420 A | * | 12/1990 | Bach | 156/643 |
| 5,436,411 A | * | 7/1995 | Pasch | 174/261 |
| 5,480,048 A | * | 1/1996 | Kitamura et al. | 216/13 |
| 6,010,956 A | * | 1/2000 | Takiguchi et al. | 438/623 |

* cited by examiner

*Primary Examiner*—Albert W. Paladini
(74) *Attorney, Agent, or Firm*—Young & Thompson

(57) ABSTRACT

A wiring substrate includes an insulating layer (1) formed with a tapered through-hole (2), a first wiring layer (3) covering an upper surface of the insulating layer (1) therewith, a second wiring layer (4) covering a lower surface of the insulating layer therewith (1), and an electrically conductive layer (5) covering an inner surface (2a) of the through-hole (2) and closing the tapered through-hole (2) at a bottom of the tapered through-hole (2).

41 Claims, 10 Drawing Sheets

WIRING SUBSTRATE, MULTI-LAYERED WIRING SUBSTRATE AND METHOD OF FABRICATING THOSE

BACKGROUND OF THE INVENTION

1. Field of the Invention

The invention relates to a wiring substrate to be used in electronic devices, a multi-layered wiring substrate formed by layering films such as a build-up wiring substrate, and method of fabricating such a wiring substrate and a multi-layered wiring substrate.

2. Description of the Related Art

There has been used a wiring substrate for an assembly of an electronic device, which substrate was fabricated generally by adhering an electrically conductive layer such as a copper foil to a hard substrate composed, for instance, of glass epoxy, and patterning the electrically conductive layer into a circuit pattern. Recently, a flexible wiring substrate comprised of a resin film has been used in place of the above-mentioned wiring substrate. Hereinbelow are explained two examples of such a flexible wiring substrate.

FIG. 1 is a cross-sectional view of a conventional wiring substrate 100 as a first example. The wiring substrate 100 is disclosed in Japanese Unexamined Patent Publication No. 10-224014.

The wiring substrate 100 is comprised of an insulating layer 31 composed of polyimide resin, a first wiring layer 34 adhered to an upper surface of the insulating layer 31 through an adhesive 32, and a second wiring layer 35 adhered to a lower surface of the insulating layer 31 through an adhesive 33.

The first and second wiring layers 34 and 35 have desired patterns and are comprised of a copper foil.

The insulating layer 31 and the first and second wiring layers 34 and 35 are formed with a through-hole 36. The through-hole 36 is covered along an inner surface thereof with an electrically conductive layer 37 which electrically connects the first and second wiring layers 34 and 35 to each other.

A through-hole 39 an outer surface of which is defined by the electrically conductive layer 37 is filled with an electrically conductive or non-conductive material 38.

The electrically conductive layer 37, the electrically conductive or non-conductive material 38, and the first wiring layer 34 are covered with a resist film 40 without a part of the first wiring layer 34.

A first electrically conductive layer 41 is formed on the first wiring layer 34 in a region not covered with the resist film 40. A second electrically conductive layer 42 is formed on the second wiring layer 35.

FIG. 2 is a cross-sectional view of a conventional wiring substrate 200 as a second example. The wiring substrate 200 is disclosed in Japanese Unexamined Patent Publication No. 9-64231.

The wiring substrate 200 is comprised of an insulating layer 51 composed of polyimide resin, a first wiring layer 54 adhered to an upper surface of the insulating layer 51 through an adhesive 52, and a second wiring layer 55 adhered to a lower surface of the insulating layer 51 through an adhesive 53.

The first and second wiring layers 54 and 55 have desired patterns and are comprised of a copper foil.

The insulating layer 51 and the first wiring layer 54 are formed with a via-hole 56 reaching the second wiring layer 55. The via-hole 56 is covered along an inner surface thereof with an electrically conductive layer 57 which covers further with the second wiring layer 55 and hence electrically connects the first and second wiring layers 54 and 55 to each other.

A recess 59 an outer surface of which is defined by the electrically conductive layer 57 is filled with an electrically conductive or non-conductive material 58.

The electrically conductive layer 57, the electrically conductive or non-conductive material 58, and the first wiring layer 54 are covered with a resist film 60 without a part of the first wiring layer 54.

A first electrically conductive layer 61 is formed on the first wiring layer 54 in a region not covered with the resist film 60. A second electrically conductive layer 62 is formed on the second wiring layer 55.

As mentioned above, the conventional wiring substrates 100 and 200 are designed to have the first and second wiring layers 34, 35 and 54, 55 adhered to the insulating layers 31 and 51 through the adhesives 32, 33 and 52, 53. Namely, the conventional wiring substrates 100 and 200 have to include a substrate coated with a copper foil, resulting in an increase in fabrication cost.

In addition, since the electrically conductive layers 37 and 57 are laid on the first and second wiring layers 34, 35 and 54, 55, there are generated a step or steps formed on the first and second wiring layers 34, 35 and 54. This results in a problem that it becomes quite difficult to fabricate the wiring substrate thinner.

Furthermore, the through- or via-hole 36 or 56 is necessary to be formed smaller as a pitch between through- or via-holes becomes smaller. However, it would be more difficult to fill the through- or via-hole 36 or 56 with a filler in the conventional wiring substrates 100 and 200, if the through- or via-hole 36 or 56 were formed smaller.

Japanese Unexamined Patent Publication No. 10-125722 has suggested a two-layered wiring substrate comprised of an insulating substrate composed of an insulating material, a first copper wiring layer formed on an upper surface of the insulating substrate, a second copper wiring layer formed on a lower surface of the insulating substrate, the insulating substrate being formed with a blind via-hole extending between the first and second wiring layers throughout the insulating substrate, and a copper plating layer formed on an inner surface of the blind via-hole to electrically connect the first and second copper wiring layers to each other.

However, the above-mentioned problems remain unsolved even in the above-mentioned Publication.

SUMMARY OF THE INVENTION

In view of the above-mentioned problems in the conventional wiring substrates, it is an object of the present invention to provide a wiring substrate which makes it no longer necessary to adhere copper foils to an insulating layer, eliminates a step or steps which was (were) formed on wiring layers, and removes difficulty in filling a through- or via-hole with a filler.

It is also an object of the present invention to provide a multi-layered wiring substrate which does the same.

It is further an object of the present invention to provide a method of fabricating the above-mentioned wiring substrate and multi-layered wiring substrate.

In one aspect of the present invention, there is provided a wiring substrate including (a) an insulating layer formed with at least one tapered through-hole, (b) a first wiring layer covering an upper surface of the insulating layer therewith, (c) a second wiring layer covering a lower surface of the insulating layer therewith, and (d) an electrically conductive layer covering an inner surface of the tapered through-hole and closing the tapered through-hole at a bottom of the tapered through-hole.

It is preferable that the electrically conductive layer is integral with the first wiring layer.

It is preferable that the electrically conductive layer is integral with the second wiring layer.

It is preferable that a relation between a diameter $\phi$ of the tapered through-hole at a bottom thereof and a thickness T of the electrically conductive layer is defined as follows:

$\phi \leq 2T$

For instance, the diameter $\phi$ may be in the range of 10 to 40 micrometers both inclusive.

For instance, the thickness T may be in the range of 5 to 30 micrometers both inclusive.

For instance, the tapered through-hole may have a taper angle in the range of 15 to 65 degrees both inclusive relative to an axis of the tapered through-hole.

It is preferable that the first and second wiring layers and the electrically conductive layer are composed of copper or copper alloy, and are formed in contact with the insulating layer without applying an adhesive therebetween.

It is preferable that the first and second wiring layers and the electrically conductive layer are comprised of an electroless plating layer.

It is preferable that the first and second wiring layers and the electrically conductive layer are comprised of an electroless plating layer and an electrolytic plating layer formed on the electroless plating layer.

It is preferable that the insulating layer and the tapered through-hole have roughness in the range of 0.1 to 10 micrometers both inclusive at surfaces thereof.

It is preferable that the insulating layer and the tapered through-hole have roughness in the range of 0.5 to 5 micrometers both inclusive at surfaces thereof.

It is preferable that the wiring substrate further includes a metal layer partially or entirely covering at least one of the first and second wiring layers therewith.

It is preferable that the metal layer is comprised of a gold layer or a palladium layer. As an alternative, the metal layer may be comprised of a nickel layer and a gold layer formed on the nickel layer, or of a nickel layer and a palladium layer formed on the nickel layer.

In another aspect of the present invention, there is provided multi-layered wiring substrate including (a) a plurality of wiring substrates each of which is defined as mentioned above, (b) an interlayer insulating layer(s) sandwiched between the wiring substrates for electrically isolating the wiring substrates from each other, and (c) an interlayer electrical conductor(s) electrically connecting the second wiring layer of an upper wiring substrate to the first wiring layer of a lower wiring substrate.

For instance, the interlayer insulating layer may be composed of adhesive resin or thermoplastic resin.

It is preferable that the adhesive resin or thermo-plastic resin has a glass transition temperature of 150 degrees centigrade or greater.

It is preferable that the interlayer electrical conductor is composed of a metal selected from a group consisting of tin, lead, silver, copper, gold and aluminum.

For instance, the interlayer electrical conductor may be composed of an alloy including at least two of tin, lead, silver, copper, gold and aluminum.

It is preferable that the interlayer electrical conductor is in the form of an electrically conductive paste.

In still another aspect of the present invention, there is provided a method of fabricating a wiring substrate, including the steps of (a) forming a tapered through-hole through an insulating layer, (b) forming an electrically conductive layer covering an inner surface of the tapered through-hole therewith such that the tapered through-hole is closed at a bottom thereof, (c) forming a first wiring layer on an upper surface of the insulating layer, and (d) forming a second wiring layer on a lower surface of the insulating layer.

It is preferable that the electrically conductive layer, the first wiring layer and the second wiring layer are concurrently and integrally formed.

It is preferable that the method may further include the step of roughening the upper and lower surfaces of the insulating layer and an inner surface of the tapered through-hole.

It is preferable that the method may further include the step of applying plating catalyst to roughened upper and lower surfaces of the insulating layer and roughened inner surface of the tapered through-hole.

It is preferable that the electrically conductive layer and the first and second wiring layers are formed by electroless plating.

It is preferable that the electrically conductive layer and the first and second wiring layers are formed by electroless plating and then electrolytic plating.

It is preferable that the tapered through-hole is formed by irradiating a laser beam to the insulating layer.

It is preferable that the tapered through-hole is formed by etching the insulating layer with strong alkaline solution.

There is further provided a method of fabricating a wiring substrate, including the steps of (a) forming a tapered through-hole through an insulating layer, (b) forming a thin plating layer both entirely on upper and lower surfaces of the insulating layer and on an inner surface of the tapered through-hole, (c) forming a resist layer on the thin plating layer except first, second and third regions, (d) forming a first wiring layer in the first region, a second wiring layer in the second region, and an electrically conductive layer in the third region on the thin plating layer, the first wiring layer covering an upper surface of the insulating layer therewith, the second wiring layer covering a lower surface of the insulating layer therewith, the electrically conductive layer covering an inner surface of the tapered through-hole therewith such that the tapered through-hole is closed at a bottom thereof, (e) removing the resist layer, and (f) removing the thin plating layer having been covered with the thus removed resist layer.

It is preferable that the thin plating layer is formed by electroless plating in the step (b).

It is preferable that the first and second wiring layers and the electrically conductive layer are formed by electroless plating in the step (d).

It is preferable that the first and second wiring layers and the electrically conductive layer are formed by electrolytic plating in the step (d).

It is preferable that the first and second wiring layers and the electrically conductive layer are formed by electroless plating and then electrolytic plating in the step (d).

There is still further provided a method of fabricating a wiring substrate, including the steps of (a) forming a tapered through-hole through an insulating layer, (b) forming a resist layer both entirely on upper and lower surfaces of the insulating layer and on an inner surface of the tapered through-hole without first, second and third regions, (c)

forming a first wiring layer in the first region, a second wiring layer in the second region, and an electrically conductive layer in the third region, the first wiring layer covering an upper surface of the insulating layer therewith, the second wiring layer covering a lower surface of the insulating layer therewith, the electrically conductive layer covering an inner surface of the tapered through-hole therewith such that the tapered through-hole is closed at a bottom thereof, and (d) removing the resist layer.

It is preferable that the first and second wiring layers and the electrically conductive layer are formed by electroless plating in the step (c).

It is preferable that the first and second wiring layers and the electrically conductive layer are formed by electroless plating and then electrolytic plating in the step (c).

There is yet further provided a method of fabricating a wiring substrate, including the steps of (a) forming a tapered through-hole through an insulating layer, (b) forming a first plating layer both entirely on upper and lower surfaces of the insulating layer and on an inner surface of the tapered through-hole, (c) forming a second plating layer on the first plating layer, the second plating layer having a thickness greater than a thickness of the first plating layer, (d) forming a resist layer on the second plating layer except first, second and third regions, (e) removing the second plating layer in the first, second and third regions to thereby form a first wiring layer in the first region, a second wiring layer in the second region, and an electrically conductive layer in the third region, the first and second wiring layers and the electrically conductive layer being composed of the first and second plating layers, the first wiring layer covering an upper surface of the insulating layer therewith, the second wiring layer covering a lower surface of the insulating layer therewith, the electrically conductive layer covering an inner surface of the tapered through-hole therewith such that the tapered through-hole is closed at a bottom thereof, and (f) removing the resist layer.

For instance, the first plating layer may be formed by electroless plating in the step (b). For instance, the second plating layer may be formed by electroless plating or electrolytic plating in the step (c). As an alternative, the second plating layer may be formed by electroless plating and then electrolytic plating in the step (c).

There is further provided a method of fabricating a multi-layered wiring substrate, each wiring substrate including (a) an insulating layer formed with at least one tapered through-hole, (b) a first wiring layer covering an upper surface of the insulating layer therewith, (c) a second wiring layer covering a lower surface of the insulating layer therewith, and (d) an electrically conductive layer covering an inner surface of the through-hole and closing the tapered through-hole at a bottom of the tapered through-hole, the method including the steps of (a) piling up a plurality of the wiring substrates such that the second wiring layer of an upper wiring substrate is electrically connected to the first wiring layer of a lower wiring substrate through an interlayer electrical conductor and that an interlayer insulating layer is sandwiched between upper and lower wiring substrates, and (b) applying heat to a resultant resulted from the step (a), in vacuum condition.

It is preferable that pressure is further applied to the resultant in the step (b).

For instance, the interlayer insulating layer may be formed by coating adhesive resin or thermo-plastic resin in liquid. The interlayer insulating layer may be formed by printing adhesive resin or thermoplastic resin in liquid. As an alternative, the interlayer insulating layer may be formed by transcribing adhesive resin or thermo-plastic resin in liquid.

It is preferable that the interlayer insulating layer is formed by thermally laminating adhesive resin or thermoplastic resin which is in the form of a film.

It is preferable that the interlayer insulating layer is formed by laminating adhesive resin or thermo-plastic resin which is in the form of a film, in vacuum condition.

The advantages obtained by the aforementioned present invention will be described hereinbelow.

In accordance with the present invention, it is no longer necessary to use a substrate which are coated at upper and lower surfaces thereof with a copper film such as a copper foil through an adhesive, unlike the conventional wiring substrates. Hence, a wiring substrate in accordance with the present invention can be fabricated at lower costs than the conventional wiring substrates.

In addition, a wiring substrate in accordance with the present invention can be fabricated thinner than the conventional wiring substrates in which an electrically conductive layer is laid on a wiring layer.

The present invention further presents a multi-layered wiring substrate providing the same advantages as mentioned above.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 3:
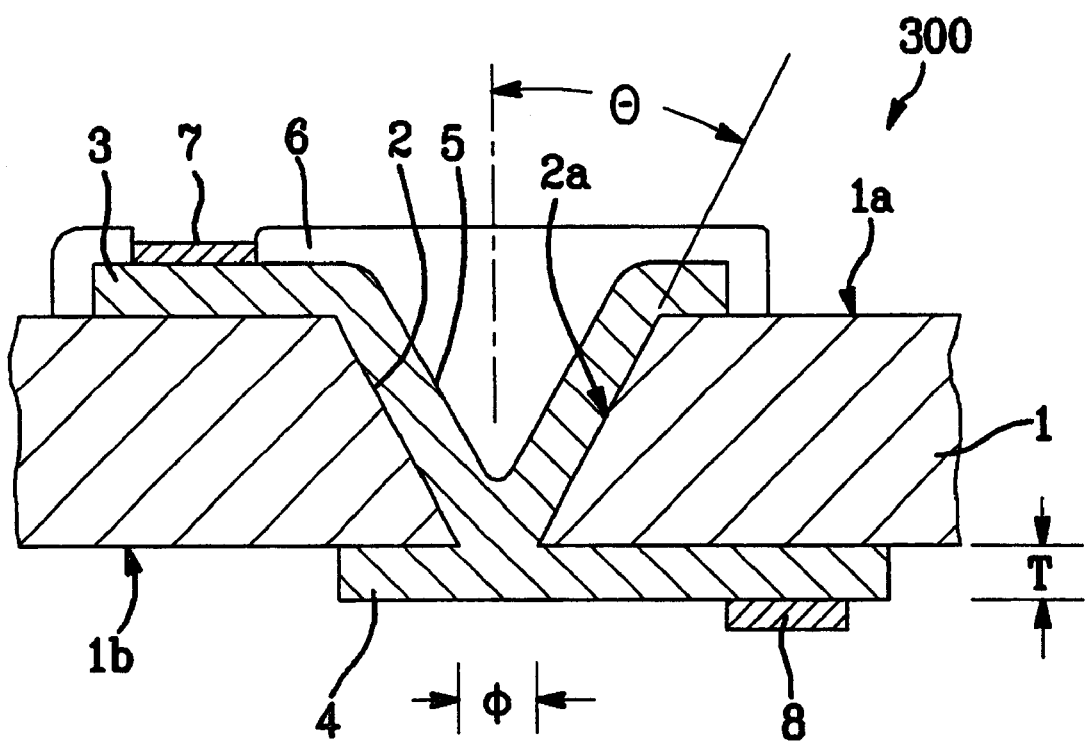
FIG. 3 is a cross-sectional view of a wiring substrate in accordance with the first embodiment of the present invention.

FIG. 3 is a cross-sectional view of a wiring substrate 300 in accordance with the first embodiment.

The wiring substrate 300 is comprised of an insulating layer 1 formed therethrough with a tapered through-hole 2, a first wiring layer 3 covering an upper surface 1a of the insulating layer 1 therewith, a second wiring layer 4 covering a lower surface 1b of the insulating layer 1 therewith, an electrically conductive layer 5 covering an inner surface 2a of the tapered through-hole 2 and closing the tapered through-hole 2 at a bottom of the tapered through-hole 2, a resist film 6 filling the through-hole 2 therewith and covering the first wiring layer 3 and the electrically conductive layer 5 therewith without a part of the electrically conductive layer 5, a first electrically conductive film 7 formed on the first wiring layer 3 in an area not covered with the resist film 6, and a second electrically conductive film 8 formed on the second wiring layer 4.

The insulating layer 1 is comprised of a total aromatic polyester liquid crystal polymer film. For instance, as a total aromatic polyester liquid crystal polymer film, there may be used CT material having a thermal expansion coefficient in the range of $15 \times 10^{-6}/°$ C. to $20 \times 10^{-6}/°$ C., a vapor transmissivity of 0.13 $g \times 20\mu/m^2 \times day$ at 40 degrees centigrade and 90% RH, a coefficient of water absorption of 0.04% at 23 degrees centigrade for 24 hours, and a glass transition temperature of 315 degrees centigrade.

As an alternative, the insulating layer 1 may be comprised of a flexible and refractory resin film composed of polyimide, epoxy or polyester, for instance.

The through-hole 2 has a tapered inner surface 2a. An inclination angle θ of the tapered inner surface 2a relative to an axis of the through-hole 2 is in the range of 15 to 65 degrees both inclusive.

As illustrated in FIG. 3, the upper and lower surfaces 1a and 1b of the insulating layer 1 and the inner surface 2a of the tapered through-hole 2 are roughened. The roughness of those surfaces is in the range of 0.1 to 10 μm both inclusive, and preferably in the range of 0.5 to 5 μm both inclusive.

The first and second wiring layers 3 and 4 are formed on the roughened upper and lower surfaces 1a and 1b without applying an adhesive therebetween. Similarly, the electrically conductive layer 5 is formed on the inner surface 2a of the tapered through-hole 2 without applying an adhesive to the inner surface 2a. The first and second wiring layers 3 and 4 and the electrically conductive layer 5 are integrally formed with one another such that the tapered through-hole 2 is closed at a bottom thereof.

In the first embodiment, the first and second wiring layers 3 and 4 and the electrically conductive layer 5 are all composed of copper. In addition, in the first embodiment, the first and second wiring layers 3 and 4 and the electrically conductive layer 5 are all designed to have a thickness T.

In the first embodiment, a relation between a diameter φ of the tapered through-hole 2 at a bottom thereof and the thickness T is set as follow:

$\phi \leq 2T$.

In the first embodiment, the diameter φ is designed in the range of 10 to 40 μm both inclusive, and the thickness T is designed in the range of 5 to 30 μm both inclusive.

In the first embodiment, the first and second electrically conductive films 7 and 8 are composed of gold. As an alternative, the first and second electrically conductive films 7 and 8 may be composed of a nickel layer and a gold layer formed on the nickel layer.

Figure 1:
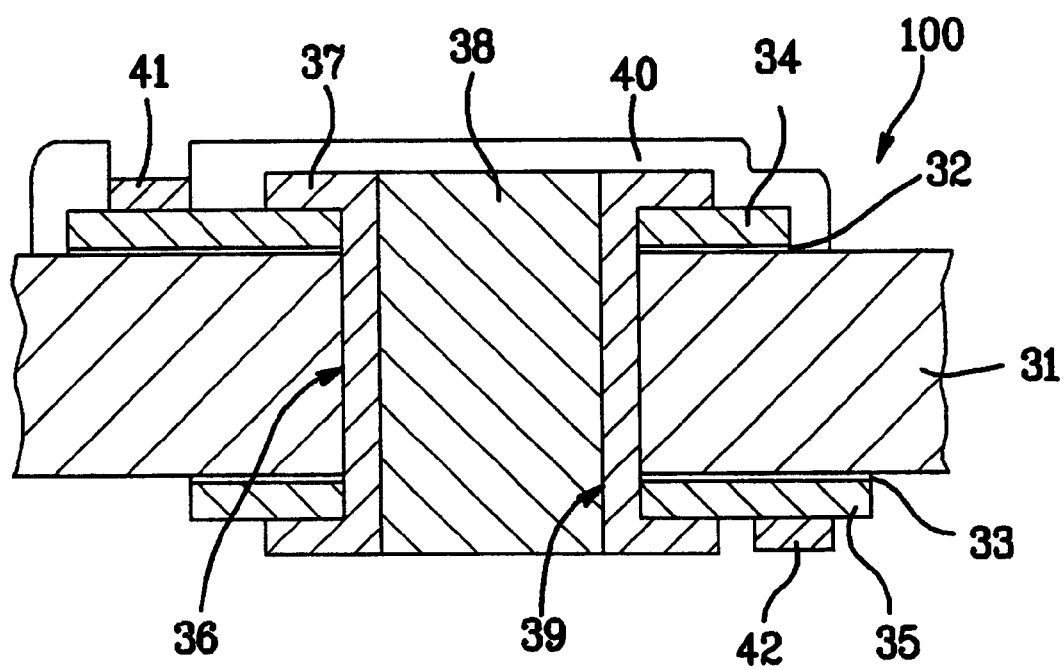
FIG. 1 is a cross-sectional view of a conventional wiring substrate.
Figure 2:
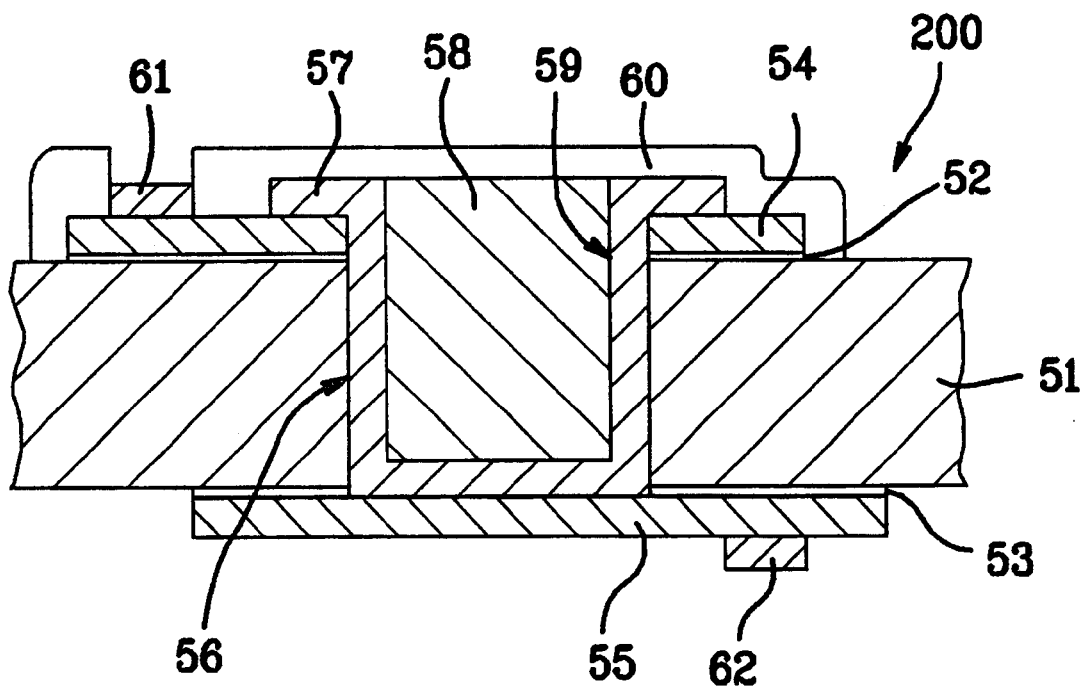
FIG. 2 is a cross-sectional view of another conventional wiring substrate.

In accordance with the first embodiment, it is no longer necessary to use a substrate which are coated at upper and lower surfaces thereof with a copper film such as a copper foil through an adhesive, unlike the conventional wiring substrates. In addition, it is no longer necessary to fill the through-hole 2 with a filler unlike the conventional wiring substrates in which the through-hole 39 (see FIG. 1) and the recess 59 (see FIG. 2) had to be filled with the electrically conductive or non-conductive material 38 and 58, respectively.

Hence, the wiring substrate 300 in accordance with the first embodiment can be fabricated at lower costs than the conventional wiring substrates.

In addition, the wiring substrate 300 can be fabricated thinner than the conventional wiring substrates in which an electrically conductive layer is laid on a wiring layer.

In the first embodiment, the upper and lower surfaces 1a and 1b of the insulating layer 1 and the inner surface 2a of the tapered through-hole 2 are roughened, and the first and second wiring layers 3 and 4 and the electrically conductive layer 5 are integrally formed on the roughened surfaces 1a, 1b and 2a, respectively. Hence, there are no steps unlike the conventional wiring substrate illustrated in FIGS. 1 and 2, in which steps are formed between the first wiring layer 34, 54 and the electrically conductive layer 37, 57 and between the second wiring layer 35, 55 and the electrically conductive layer 37, 57.

In addition, since the first and second wiring layers 3 and 4 and the electrically conductive layer 5 are formed on the roughened surfaces 1a and 1b of the insulating layer 1 and the roughened inner surface 2a of the tapered through-hole 2, the insulating layer 1 has a remarkably high adhesion strength with the first and second wiring layers 3 and 4 and the electrically conductive layer 5. As a result, the first and second wiring layers 3 and 4 and the electrically conductive layer 5 are not peeled off the insulating layer 1.

Hereinbelow is explained a method of fabricating the above-mentioned wiring substrate 300 in accordance with the first embodiment.

Figure 4:
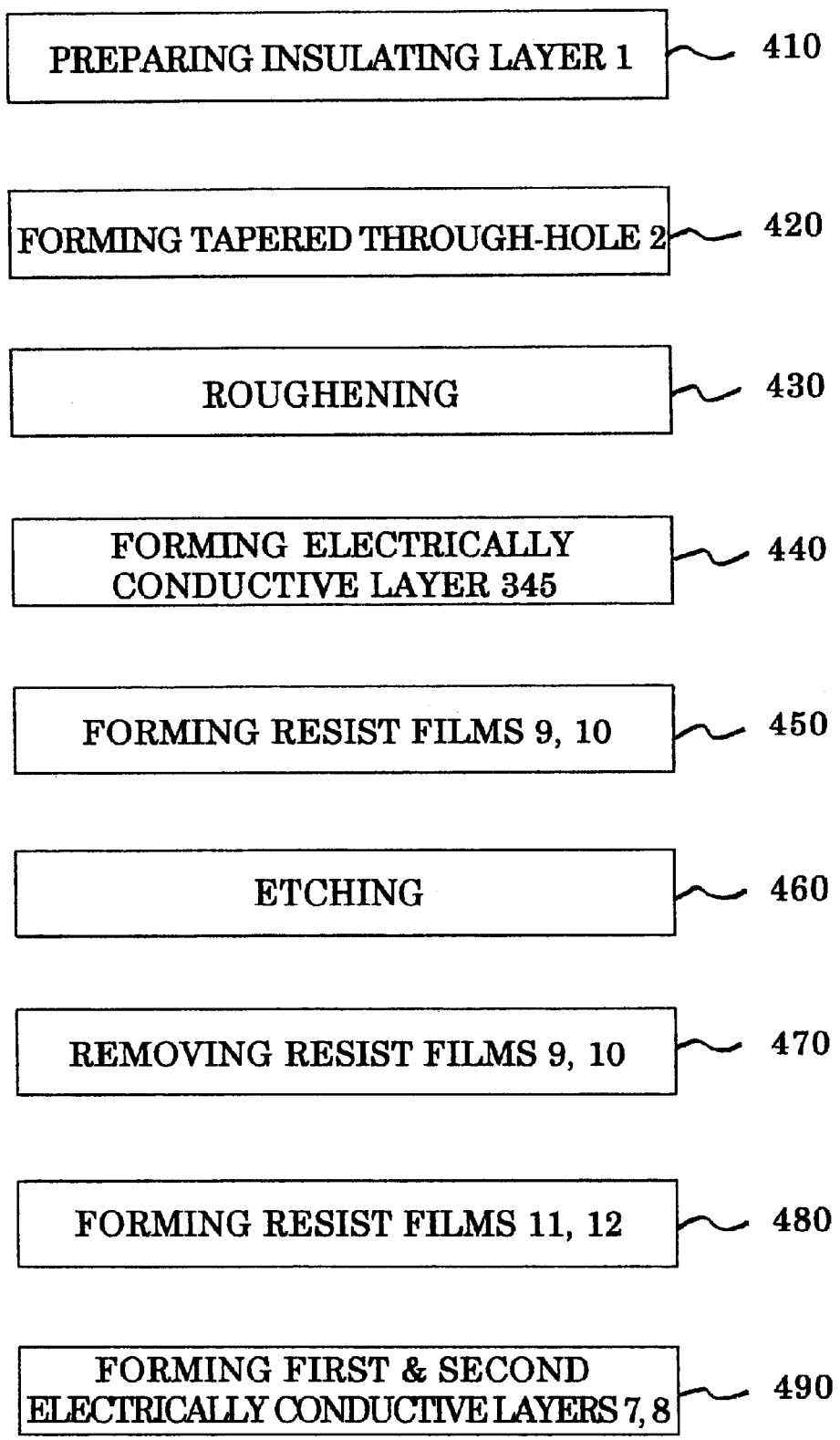
FIG. 4 is a flow chart of a method of fabricating a wiring substrate in accordance with the first embodiment.

FIG. 4 is a flow chart of a method of fabricating the wiring substrate, and FIGS. 5A to 5I are cross-sectional views of the wiring substrate 300, illustrating respective steps of a method of fabricating the same.

Figure 5A:
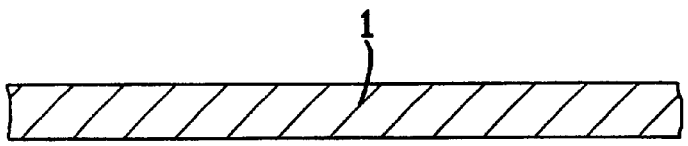
FIGS. 5A to 5I are cross-sectional views of a wiring substrate in accordance with the first embodiment, illustrating respective steps of a method of fabricating the same.

First, as illustrated in FIG. 5A, there is prepared the insulating layer 1 comprised of a liquid crystal polymer film, for instance, in step S410.

Figure 5B:
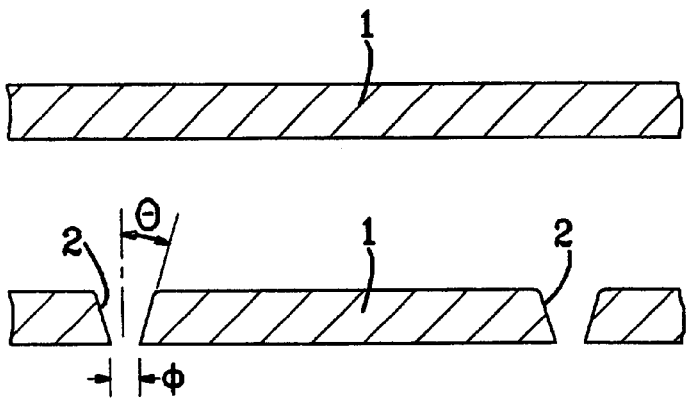

Then, as illustrated in FIG. 5B, the tapered through-holes 2 are formed throughout the insulating layer 1, in step S420.

The tapered through-holes 2 can be formed with a high accuracy by applying laser beams to the insulating layer 1. As an alternative, the tapered through-holes 2 may be formed by mechanical boring or by etching through the use of strong alkaline solution.

The tapered through-holes 2 are formed to have a diameter φ at a bottom in the range of 10 to 40 μm both inclusive.

If the diameter φ is smaller than 10 μm, plating solution is reluctant to flow into the tapered through-hole 2, resulting in a reduction in a rate at which the electrically conductive layer 5 is formed. If the diameter φ is greater than 40 μm, it would be difficult to close the tapered through-hole 2 by the second wiring layer 4 and the electrically conductive layer 5. Hence, the diameter φ at a bottom of the tapered through-hole 2 is designed in the range of 10 to 40 μm both inclusive.

An inclination angle θ of the tapered inner surface 2a relative to an axis of the through-hole 2 is in the range of 15 to 65 degrees both inclusive.

If the inclination angle θ is smaller than 15 degrees, it would be quite difficult to form the electrically conductive layer 5, because a diameter of the tapered through-hole 2 is too small. In addition, the inclination angle θ smaller than 15 degrees would result unstable connection between the first wiring layer 3 and the electrically conductive layer 5 at a shoulder of the tapered through-hole 2. If the inclination angle θ is greater than 65 degrees, an integration density would be lowered, because a diameter of the tapered through-hole 2 at a shoulder is too great. Hence, the inclination angle θ is designed in the range of 15 to 65 degrees both inclusive.

At this stage, since the upper and lower surfaces 1a and 1b of the insulating layer 1 and the inner surface 2a of the tapered through-hole 2 are flat or non-roughened, it would be impossible to form the first and second wiring layers 3 and 4 and the electrically conductive layer 5 directly on the upper and lower surfaces 1a and 1b and the inner surface 2a by electroless copper plating.

Figure 5C:
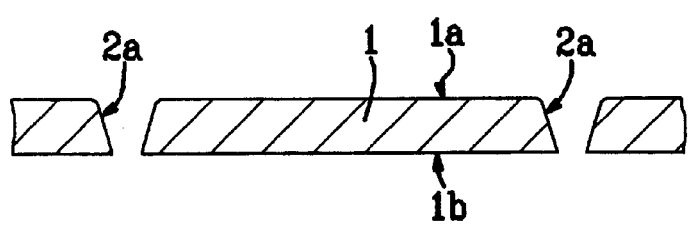

Then, as illustrated in FIG. 5C, the upper and lower surfaces 1a and 1b of the insulating layer 1 and the inner surface 2a of the tapered through-hole 2 are roughened by wet blasting or liquid honing such that the surfaces 1a, 1b and 2a have a surface roughness in the range of 0.1 to 10 μm both inclusive, preferably in the range of 0.5 to 5 μm both inclusive, in step S430.

The surfaces 1a, 1b and 2a are roughened in the following conditions.

Used particles: polygonal abrasive particles

Diameter of particles: about 5 to 300 μm

Figure 5D:
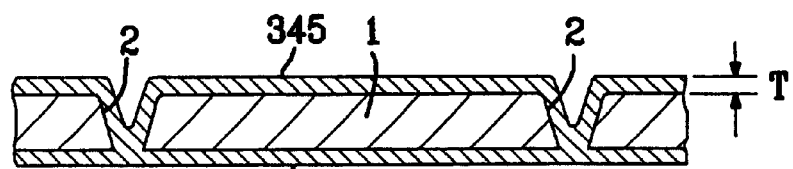

Hardness of particles: 1300 to 2500 in Knoop hardness or 7 to 15 in Mohs hardness Pump pressure: 1 to 5 $kg/cm^2$ Ratio of particles to liquid: 5 to 40 volume percents Then, plating catalyst is applied to the roughened surfaces 1a, 1b and 2a through the use of palladium. Then, as illustrated in FIG. 5D, electroless copper plating is accomplished directly onto the surfaces 1a, 1b and 2a to thereby form an electrically conductive layer 345 on the surfaces 1a, 1b and 2a such that a relation between a diameter φ of the tapered through-hole 2 at a bottom thereof and a thickness T of the thus formed electrically conductive layer 345 is defined as $\phi \leq 2T$, in step S440. The relation of $\phi \leq 2T$ results in that the tapered through-hole 2 is closed at a bottom thereof by both the electrically conducive layer 345 formed on the lower surface 1b of the insulating layer 1 and the electrically conductive layer 345 formed on the inner surface 2a of the tapered through-hole 2.

The thus formed electrically conductive layer 345 has a thickness T in the range of about 5 to 80 μm.

The electrically conductive layer 345 may be formed by firstly forming an electroless copper plating layer and secondly forming an electrolytic copper plating layer on the electroless copper plating layer such that the thus formed electrically conductive layer 345 has a thickness T in the range of about 5 to 80 μm.

Figure 5E:
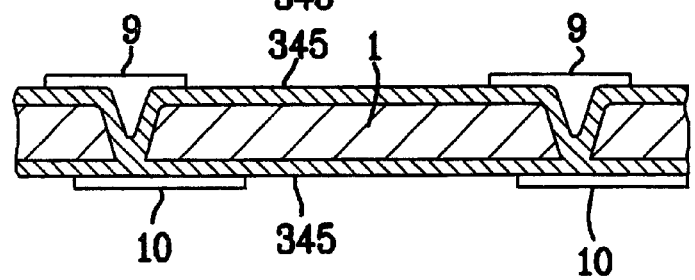

Then, as illustrated in FIG. 5E, resist films 9 and 10 are formed on the upper and lower surfaces 1a and 1b of the insulating layer 1, and then, are patterned into a such pattern that the first wiring layer 3 is formed on the upper surface 1a of the insulating layer 1, the second wiring layer 4 is formed on the lower surface 1b of the insulating layer 1, and the electrically conductive layer 5 is formed on the inner surface 2a of the tapered through-hole 2, in step S450.

Figure 5F:
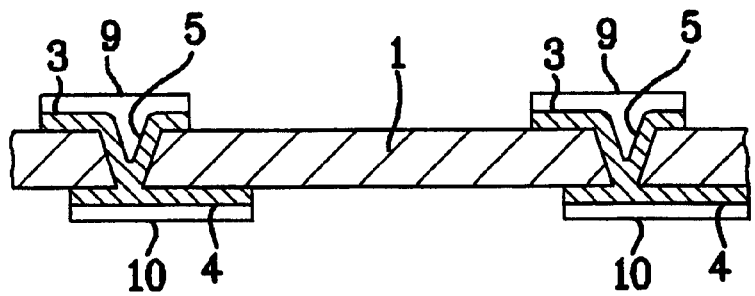

The, the electrically conductive layer 345 is etched with the resist films 9 and 10 being used as a mask, in step S460. As a result, as illustrated in FIG. 5F, there are formed the first wiring layer 3, the second wiring layer 4 and the electrically conductive layer 5 on the upper surface 1a, the lower surface 1b and the inner surface 2a, respectively.

Figure 5G:
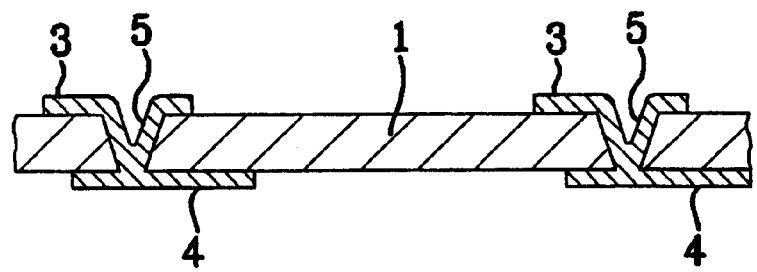

Then, as illustrated in FIG. 5G, the resist films 9 and 10 are removed, in step S470, resulting in that the first and second wiring layers 3 and 4 and the electrically conductive layer 5 appear.

Figure 5H:
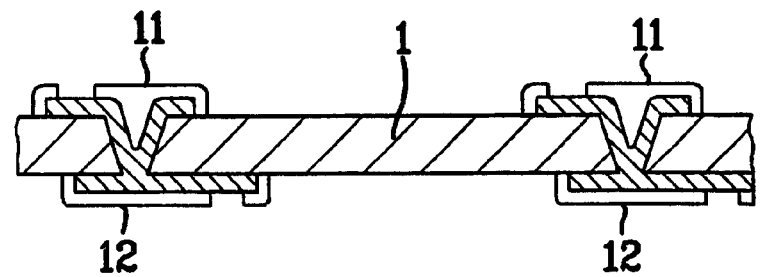

Then, as illustrated in FIG. 5H, a resist film 11 having a desired pattern is formed on the first wiring layer 3 and the electrically conductive layer 5 such that a part of the first wiring layer 3 is exposed, and a resist film 12 having a desired pattern is formed on the second wiring layer 4 such that a part of the second wiring layer 4 is exposed, in step S480.

Figure 5I:
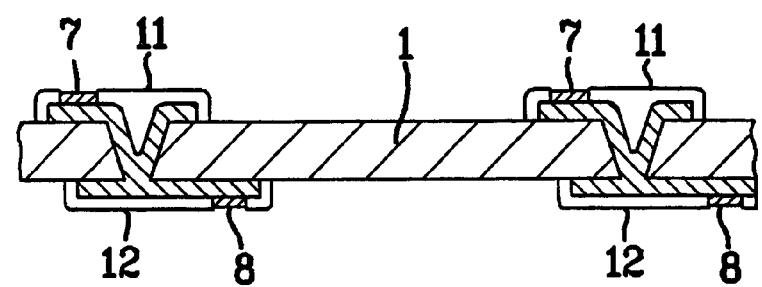

Then, as illustrated in FIG. 5I, the first and second electrically conductive layers 7 and 8 are formed on the first and second wiring layers 3 and 4 in areas not covered with the resist films 11 and 12, respectively, in step S490.

The first and second electrically conductive layers 7 and 8 are composed of gold, and are formed by electroless plating, electrolytic plating, or firstly electroless plating and then electrolytic plating.

Thereafter, the resist film 12 is removed, if necessary. As an alternative, after the resist films 11 and 12 have been removed, the resist film 6 may be formed on the first wiring layer 3 and the electrically conductive layer 5 in necessary areas.

Thus, the wiring substrate 300 in accordance with the first embodiment, illustrated in FIG. 3, is completed.

In accordance with the above-mentioned method, since the upper and lower surfaces 1a and 1b of the insulating layer 1 and the inner surface 2a of the tapered through-hole 2a are roughened, it is possible to apply electroless plating directly to the surfaces 1a, 1b and 2a without applying an adhesive onto the surfaces 1a, 1b and 2a. Accordingly, it is no longer necessary to use a substrate coated at upper and lower surfaces thereof with a copper foil by means of an adhesive, and it is now possible to use an insulating layer composed of polyimide or polymer with the result of reduction in fabrication costs of the insulating layer.

In addition, since the first and second wiring layers 3 and 4 and the electrically conductive layer 5 can be concurrently formed in the above-mentioned method, the layers 3, 4 and 5 can be formed more rapidly than a conventional method in which the layers 3, 4 and 5 are formed in turn. This ensures reduction in both the number of fabrication steps and time for fabricating the layers 3, 4 and 5.

Furthermore, the wiring substrate 300 can be fabricated thinner than the conventional wiring substrates. In the above-mentioned method, since the first wiring layer 3 and the electrically conductive layer 5 are formed integrally with each other. Hence, there are no steps unlike the conventional wiring substrate illustrated in FIGS. 1 and 2, in which steps are formed between the first wiring layer 34, 54 and the electrically conductive layer 37, 57 and between the second wiring layer 35, 55 and the electrically conductive layer 37, 57.

In accordance with the above-mentioned method, it is no longer necessary to fill the through-holes 36 and 56 (see FIGS. 1 and 2) with a filler such as an electrically conductive paste, resulting in reduction in fabrication costs. However, it should be noted that though it is not necessary to fill the tapered through-hole 2 with a filler such as an electrically conductive paste, the tapered through-hole 2 may be filled with a filler.

In the first embodiment, the insulating layer 1 is comprised of a total aromatic polyester liquid crystal polymer film. The insulating layer 1 has a water absorption coefficient of 0.04% at 23 degrees centigrade for 24 hours, whereas a polyimide resin film of which an insulating layer is comprised in a conventional wiring substrate has a water absorption coefficient of 2.9% at 23 degrees for 24 hours. Hence, the water absorption coefficient of the insulating layer 1 is about 1/70 of the water absorption coefficient of an insulating layer used in a conventional wiring substrate.

Such a smaller water absorption coefficient of the insulating layer 1 provides an advantage as follows. In the first embodiment, a dimensional change rate caused by moisture absorption in the insulating layer 1 is $4 \times 10^{-6}/°$ C. (RH) in the step of wet blasting or liquid honing for roughening the upper and lower surfaces 1a and 1b of the insulating layer 1, or the step of subsequently forming a solder resist. In contrast, a dimensional change rate caused by moisture absorption in a polyimide resin film as an insulating layer in a conventional wiring substrate is $22 \times 10^{-6}/°$ C. (RH) in the same steps. That is, a dimensional change rate caused by moisture absorption in the insulating layer 1 is about ⅕ of the same in a conventional insulating layer, ensuring no deformation in a wiring pattern in a circuit.

However, it should be noted that the insulating layer 1 in the first embodiment may be comprised of a polymer film such as a polyimide film, in place of a total aromatic polyester liquid crystal polymer film.

Figure 6:
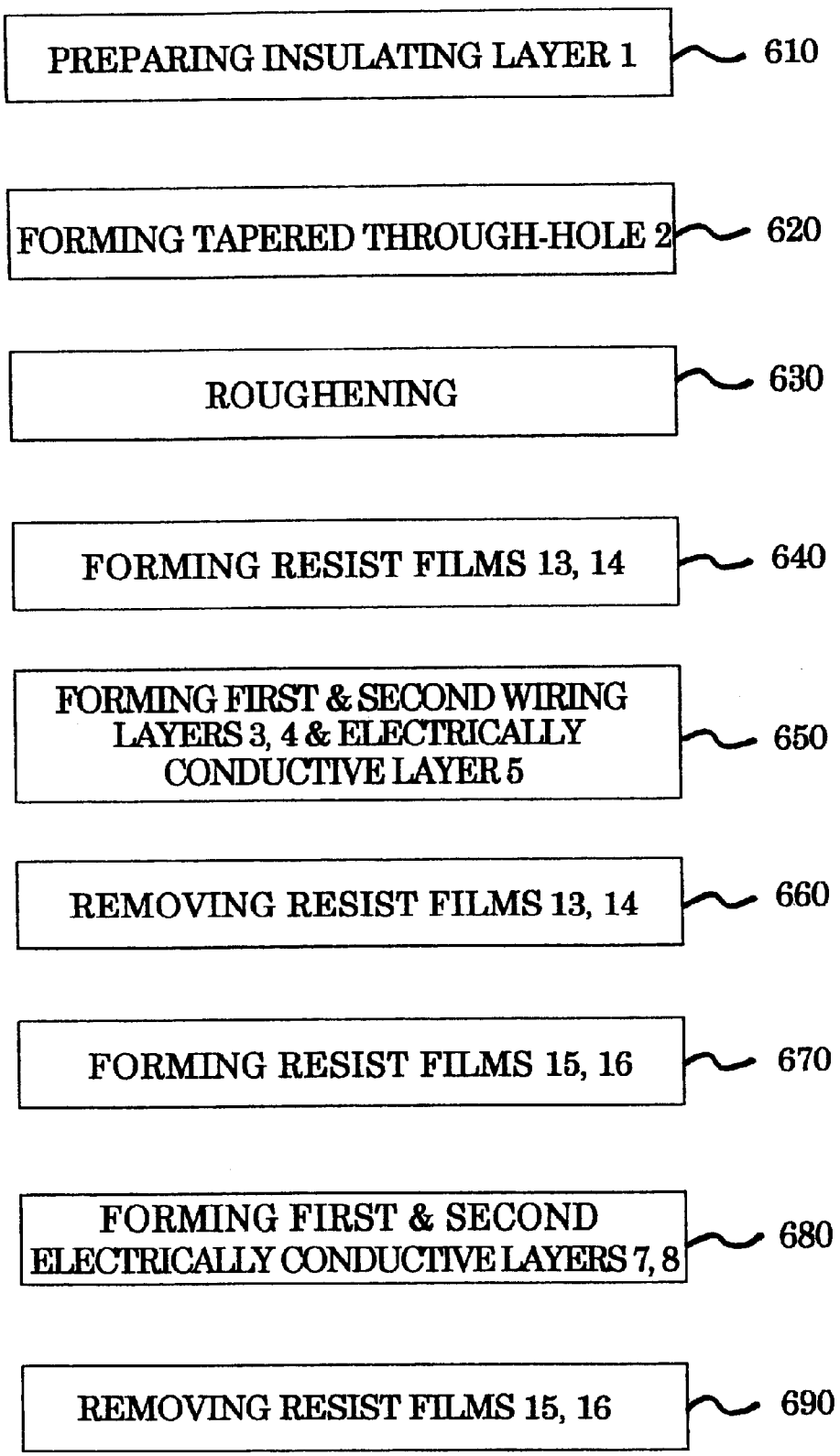
FIG. 6 is a flow chart of another method of fabricating a wiring substrate in accordance with the first embodiment.

FIG. 6 is a flow chart of another method of fabricating the wiring substrate 300.

First, there is prepared the insulating layer 1 comprised of a liquid crystal polymer film, for instance, in step S610.

Then, the tapered through-holes 2 are formed throughout the insulating layer 1 by applying laser beams to the insulating layer 1, for instance, in step S620.

Then, the upper and lower surfaces 1a and 1b of the insulating layer 1 and the inner surface 2a of the tapered through-hole 2 are roughened by wet blasting or liquid honing such that the surfaces 1a, 1b and 2a have a surface roughness in the range of 0.1 to 10 μm both inclusive, in step S630.

Then, plating catalyst is applied to the roughened surfaces 1a, 1b and 2a through the use of palladium.

Then, resist films 13 and 14 are formed on the upper and lower surfaces 1a and 1b of the insulating layer 1, in step S640. The resist films 13 and 14 have a pattern having openings coincident in shape with the first and second wiring layers 3 and 4 and the electrically conductive layer 5.

Then, an electrical conductor is plated on the insulating layer 1 by electroless plating with the resist films 13 and 14 being used as masks. As a result, the first and second wiring layers 3 and 4 and the electrically conductive layer 5 are formed on the insulating layer 1 in areas not covered with the resist films 13 and 14, in step S650.

The electrical conductor may be plated firstly by electroless plating and subsequently by electrolytic plating.

Then, the resist films 13 and 14 are removed in step S660.

Then, resist films 15 and 16 each having a pattern for fabricating the first and second electrically conductive layers 7 and 8 are formed on the first and second wiring layers 3 and 4, in step S670.

Then, an electrical conductor is deposited with the resist films 15 and 16 being used as masks to thereby form the first and second electrically conductive layers 7 and 8 on the first and second wiring layers 3 and 4, respectively, in step S680.

Then, the resist films 15 and 16 are removed, in step S690.

Thus, there is completed the wiring substrate 300.

Figure 7:
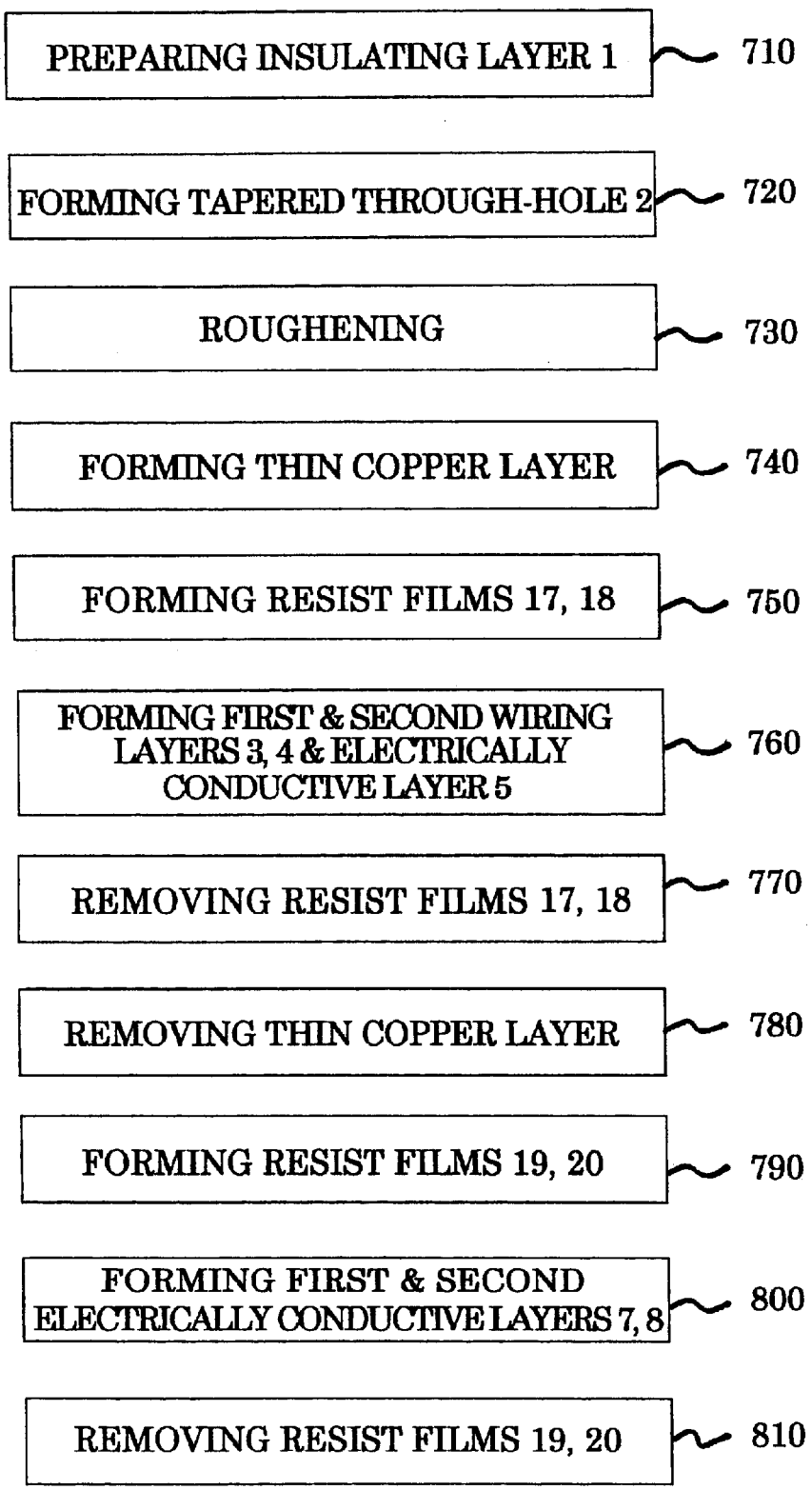
FIG. 7 is a flow chart of still another method of fabricating a wiring substrate in accordance with the first embodiment.

FIG. 7 is a flow chart of still another method of fabricating the wiring substrate 300.

First, there is prepared the insulating layer 1 comprised of a liquid crystal polymer film, for instance, in step S710.

Then, the tapered through-holes 2 are formed throughout the insulating layer 1 by applying laser beams to the insulating layer 1, for instance, in step S720.

Then, the upper and lower surfaces 1a and 1b of the insulating layer 1 and the inner surface 2a of the tapered through-hole 2 are roughened by wet blasting or liquid honing such that the surfaces 1a, 1b and 2a have a surface roughness in the range of 0.1 to 10 μm both inclusive, in step S730.

Then, plating catalyst is applied to the roughened surfaces 1a, 1b and 2a through the use of palladium.

Then, a thin copper layer is formed on the surfaces 1a, 1b and 2a by electroless plating, in step S740.

Then, resist films 17 and 18 are formed on the thin copper layer, in step S750. The resist films 17 and 18 have a pattern having openings coincident in shape with the first and second wiring layers 3 and 4 and the electrically conductive layer 5.

Then, an electrical conductor is plated on the thin copper layer by electroless plating with the resist films 17 and 18 being used as masks. As a result, the first and second wiring layers 3 and 4 and the electrically conductive layer 5 are formed on the thin copper layer in areas not covered with the resist films 17 and 18, in step S760.

The electrical conductor may be plated by electrolytic plating, or firstly by electroless plating and subsequently by electrolytic plating.

Then, the resist films 17 and 18 are removed in step S770.

Then, the thin copper layer having been covered with the resist films 17 and 18 are removed, in step S780.

Then, resist films 19 and 20 each having a pattern for fabricating the first and second electrically conductive layers 7 and 8 are formed on the first and second wiring layers 3 and 4, in step S790.

Then, an electrical conductor is deposited with the resist films 19 and 20 being used as masks to thereby form the first and second electrically conductive layers 7 and 8 on the first and second wiring layers 3 and 4, respectively, in step S800.

Then, the resist films 19 and 20 are removed, in step S810.

Thus, there is completed the wiring substrate 300.

Figure 8:
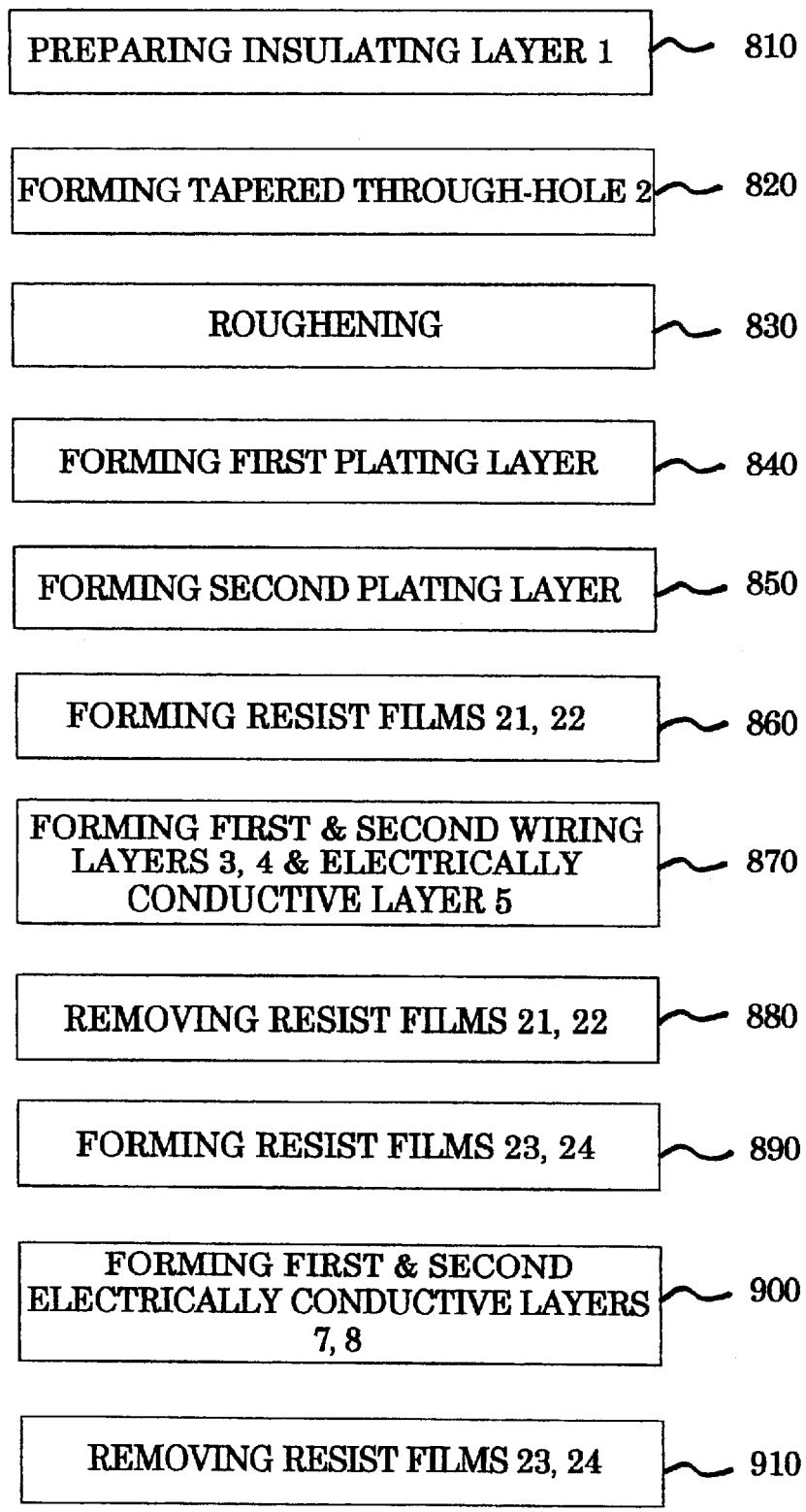
FIG. 8 is a flow chart of yet another method of fabricating a wiring substrate in accordance with the first embodiment.

FIG. 8 is a flow chart of yet another method of fabricating the wiring substrate 300.

First, there is prepared the insulating layer 1 comprised of a liquid crystal polymer film, for instance, in step S810.

Then, the tapered through-holes 2 are formed throughout the insulating layer 1 by applying laser beams to the insulating layer 1, for instance, in step S820.

Then, the upper and lower surfaces 1a and 1b of the insulating layer 1 and the inner surface 2a of the tapered through-hole 2 are roughened by wet blasting or liquid honing such that the surfaces 1a, 1b and 2a have a surface roughness in the range of 0.1 to 10 μm both inclusive, in step S830.

Then, plating catalyst is applied to the roughened surfaces 1a, 1b and 2a through the use of palladium.

Then, a first plating layer is formed on both the upper and lower surfaces 1a and 1b of the insulating layer 1 and the inner surface 1a of the tapered through-hole 2, in step S840.

Then, a second plating layer is formed entirely on the first plating layer. The second plating layer has a thickness greater than a thickness of the first plating layer, in step S850.

Then, resist films 21 and 22 are formed on the second plating layer, in step S860. The resist films 21 and 22 have a pattern having openings coincident in shape with the first and second wiring layers 3 and 4 and the electrically conductive layer 5.

Then, the second plating layer is etched with the resist films 21 and 22 being used as mask.

As a result, the first and second wiring layers 3 and 4 and the electrically conductive layer 5 are formed on the insulating layer 1 in areas not covered with the resist films 21 and 22, in step S870. The thus formed first and second wiring layers 3 and 4 and the electrically conductive layer 5 are formed of the first and second plating layers.

Then, the resist films 21 and 22 are removed, in step S880.

Then, resist films 23 and 24 each having a pattern for fabricating the first and second electrically conductive layers 7 and 8 are formed on the first and second wiring layers 3 and 4, in step S890.

Then, an electrical conductor is deposited with the resist films 23 and 24 being used as masks to thereby form the first and second electrically conductive layers 7 and 8 on the first and second wiring layers 3 and 4, respectively, in step S900.

Then, the resist films 23 and 24 are removed, in step S910.

Thus, there is completed the wiring substrate 300.

Figure 9:
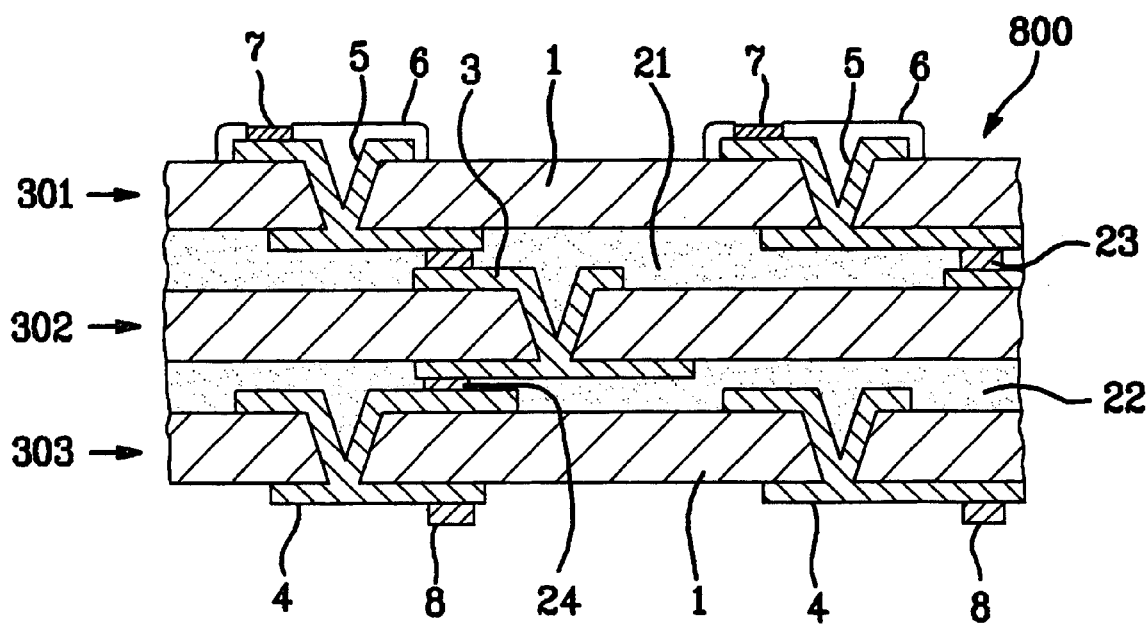
FIG. 9 is a cross-sectional view of a multi-layered wiring substrate in accordance with a second embodiment of the present invention.

FIG. 9 is a cross-sectional view of a multi-layered wiring substrate 800 in accordance with the second embodiment of the present invention.

The multi-layered wiring substrate 800 can be fabricated by piling up a plurality of the wiring substrates 300 one on another with an interlayer insulating film being sandwiched between the adjacent wiring substrates 300.

The multi-layered wiring substrate 800 illustrated in FIG. 9 is a three-layered wiring substrate including first, second and third wiring substrates 301, 302 and 303 with a first interlayer insulating layer 21 being sandwiched between the first and second wiring substrates 301 and 302 and further with a second interlayer insulating layer 22 being sandwiched between the second and third wiring substrates 302 and 303.

The first, second and third wiring substrates 301, 302 and 303 has the same structure as that of the above-mentioned wiring substrate 300. However, it should be noted that the first, second and third wiring substrates 301, 302 and 303 may be modified to conform to a structure of a multi-layered wiring substrate.

The first and second interlayer insulating layers 21 and 22 are composed of adhesive resin or thermo-plastic resin. For instance, the first and second interlayer insulating layers 21 and 22 may be formed by spin-coating, curtain-coating, screen-printing or transcribing adhesive resin or thermo-plastic resin in the form of liquid. As an alternative, the first and second interlayer insulating layers 21 and 22 may be formed by thermally laminating, laminating in vacuum or thermally laminating in vacuum adhesive resin or thermo-plastic resin in the form of a film. As an alternative, the first and second interlayer insulating layers 21 and 22 may be formed by thermally pressing or thermally pressing in vacuum.

The first and second interlayer insulating layers 21 and 22 have a glass transition temperature Tg of 150 degrees centigrade or greater, preferably 200 degrees centigrade or greater, in order to make is possible to mount a device such as a semiconductor chip on the multi-layered wiring substrate 800.

Referring back to FIG. 9, the first to third wiring substrates 301 to 303 are electrically connected to one another through first and second interlayer electrical conductors 23 and 24.

Specifically, the first interlayer electrical conductor 23 electrically connects the second wiring layer 4 of the first wiring substrate 301 to the first wiring layer 3 of the second wiring substrate 302. The second interlayer electrical conductor 24 electrically connects the second wiring layer 4 of the second wiring substrate 302 to the first wiring layer 3 of the third wiring substrate 303.

The first and second interlayer electrical conductors 23 and 24 are composed of soft metal such as tin, lead, silver, copper, gold or aluminum, soft alloy containing at least two of tin, lead, silver, copper, gold and aluminum, or soft alloy predominantly containing at least one of tin, lead, silver, copper, gold and aluminum, and further containing other metal or metals.

As an alternative, the first and second interlayer electrical conductors 23 and 24 may be composed of an electrically conductive paste containing the above-mentioned soft metal or soft alloy.

Though the first and second interlayer electrical conductors 23 and 24 are designed to electrically connect the second wiring layer 4 of the upper wiring substrate to the first wiring layer 3 of the lower wiring substrate, the first and second interlayer electrical conductors 23 and 24 may be designed to electrically connect the second wiring layer 4 of the upper wiring substrate to the electrically conductive layer 5 of the lower wiring substrate.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-17729 filed on Jun. 24, 1999 including specification, claims, drawings and summary is incorporated herein by reference in its entirety.

What is claimed is:

1. A wiring substrate comprising:
   (a) an insulating layer formed with at least one tapered through-hole;
   (b) a first wiring layer covering an upper surface of said insulating layer therewith;
   (c) a second wiring layer covering a lower surface of said insulating layer therewith; and
   (d) an electrically conductive layer covering an inner surface of said tapered through-hole and closing said tapered through-hole at a bottom of said tapered through-hole.

2. The wiring substrate as set forth in claim 1, wherein said electrically conductive layer is integral with said first wiring layer.

3. The wiring substrate as set forth in claim 1, wherein said electrically conductive layer is integral with said second wiring layer.

4. The wiring substrate as set forth in claim 1, wherein a relation between a diameter $\phi$ of said tapered through-hole at a bottom thereof and a thickness T of said electrically conductive layer is defined as follows:

$$\phi \leq 2T.$$

5. The wiring substrate as set forth in claim 4, wherein said diameter $\phi$ is in the range of 10 to 40 micrometers both inclusive.

6. The wiring substrate as set forth in claim 4, wherein said thickness T is in the range of 5 to 30 micrometers both inclusive.

7. The wiring substrate as set forth in claim 1, wherein said tapered through-hole has a taper angle in the range of 15 to 65 degrees both inclusive relative to an axis of said tapered through-hole.

8. The wiring substrate as set forth in claim 1, wherein said first and second wiring layers and said electrically conductive layer are composed of copper or copper alloy, and are formed in contact with said insulating layer without applying an adhesive therebetween.

9. The wiring substrate as set forth in claim 1, wherein said first and second wiring layers and said electrically conductive layer are comprised of an electroless plating layer.

10. The wiring substrate as set forth in claim 1, wherein said first and second wiring layers and said electrically conductive layer are comprised of an electroless plating layer and an electrolytic plating layer formed on said electroless plating layer.

11. The wiring substrate as set forth in claim 1, wherein said insulating layer and said tapered through-hole have roughness in the range of 0.1 to 10 micrometers both inclusive at surfaces thereof.

12. The wiring substrate as set forth in claim 1, wherein said insulating layer and said tapered through-hole have roughness in the range of 0.5 to 5 micrometers both inclusive at surfaces thereof.

13. The wiring substrate as set forth in claim 1, further comprising a metal layer partially or entirely covering at least one of said first and second wiring layers therewith.

14. The wiring substrate as set forth in claim 13, wherein said metal layer is comprised of a gold layer.

15. The wiring substrate as set forth in claim 13, wherein said metal layer is comprised of a palladium layer.

16. The wiring substrate as set forth in claim 13, wherein said metal layer is comprised of a nickel layer and a gold layer formed on said nickel layer.

17. The wiring substrate as set forth in claim 13, wherein said metal layer is comprised of a nickel layer and a palladium layer formed on said nickel layer.

18. A multi-layered wiring substrate comprising:
 (a) a plurality of wiring substrates each including:
  (a1) an insulating layer formed with at least one tapered through-hole;
  (a2) a first wiring layer covering an upper surface of said insulating layer therewith;
  (a3) a second wiring layer covering a lower surface of said insulating layer therewith; and
  (a4) an electrically conductive layer covering an inner surface of said through-hole and closing said tapered through-hole at a bottom of said tapered through-hole;
 (b) an interlayer insulating layer(s) sandwiched between said wiring substrates for electrically isolating said wiring substrates from each other; and
 (c) an interlayer electrical conductor(s) electrically connecting said second wiring layer of an upper wiring substrate to said first wiring layer of a lower wiring substrate.

19. The multi-layered wiring substrate as set forth in claim 18, wherein said interlayer insulating layer is composed of adhesive resin.

20. The multi-layered wiring substrate as set forth in claim 19, wherein said adhesive resin has a glass transition temperature of 150 degrees centigrade or greater.

21. The multi-layered wiring substrate as set forth in claim 18, wherein said interlayer insulating layer is composed of thermo-plastic resin.

22. The multi-layered wiring substrate as set forth in claim 21, wherein said thermo-plastic resin has a glass transition temperature of 150 degrees centigrade or greater.

23. The multi-layered wiring substrate as set forth in claim 18, wherein said interlayer electrical conductor is composed of a metal selected from a group consisting of tin, lead, silver, copper, gold and aluminum.

24. The multi-layered wiring substrate as set forth in claim 18, wherein said interlayer electrical conductor is composed of an alloy including at least two of tin, lead, silver, copper, gold and aluminum.

25. The multi-layered wiring substrate as set forth in claim 18, wherein said interlayer electrical conductor is in the form of an electrically conductive paste.

26. The multi-layered wiring substrate as set forth in claim 18, wherein said electrically conductive layer is integral with said first wiring layer.

27. The multi-layered wiring substrate as set forth in claim 18, wherein said electrically conductive layer is integral with said second wiring layer.

28. The multi-layered wiring substrate as set forth in claim 18, wherein a relation between a diameter $\phi$ of said tapered through-hole at a bottom thereof and a thickness T of said electrically conductive layer is defined as follows:

$$\phi \leq 2T.$$

29. The multi-layered wiring substrate as set forth in claim 28, wherein said diameter $\phi$ is in the range of 10 to 40 micrometers both inclusive.

30. The multi-layered wiring substrate as set forth in claim 28, wherein said thickness T is in the range of 5 to 30 micrometers both inclusive.

31. The multi-layered wiring substrate as set forth in claim 18, wherein said tapered through-hole has a taper angle in the range of 15 to 65 degrees both inclusive relative to an axis of said tapered through-hole.

32. The multi-layered wiring substrate as set forth in claim 18, wherein said first and second wiring layers and said electrically conductive layer are composed of copper or copper alloy, and are formed in contact with said insulating layer without applying an adhesive therebetween.

33. The multi-layered wiring substrate as set forth in claim 18, wherein said first and second wiring layers and said electrically conductive layer are comprised of an electroless plating layer.

34. The multi-layered wiring substrate as set forth in claim 18, wherein said first and second wiring layers and said electrically conductive layer are comprised of an electroless plating layer and an electrolytic plating layer formed on said electroless plating layer.

35. The multi-layered wiring substrate as set forth in claim 18, wherein said insulating layer and said tapered through-hole have roughness in the range of 0.1 to 10 micrometers both inclusive at surfaces thereof.

36. The multi-layered wiring substrate as set forth in claim 18, wherein said insulating layer and said tapered through-hole have roughness in the range of 0.5 to 5 micrometers both inclusive at surfaces thereof.

37. The multi-layered wiring substrate as set forth in claim 18, further comprising a metal layer partially or entirely covering at least one of said first and second wiring layers therewith.

38. The multi-layered wiring substrate as set forth in claim 37, wherein said metal layer is comprised of a gold layer.

39. The multi-layered wiring substrate as set forth in claim 37, wherein said metal layer is comprised of a palladium layer.

40. The multi-layered wiring substrate as set forth in claim 37, wherein said metal layer is comprised of a nickel layer and a gold layer formed on said nickel layer.

41. The multi-layered wiring substrate as set forth in claim 37, wherein said metal layer is comprised of a nickel layer and a palladium layer formed on said nickel layer.

* * * * *